(12) United States Patent
Jansen et al.

(10) Patent No.: US 8,564,757 B2
(45) Date of Patent: *Oct. 22, 2013

(54) LITHOGRAPHIC APPARATUS AND A METHOD OF OPERATING THE APPARATUS

(75) Inventors: Bauke Jansen, Deurne (NL); Richard Joseph Bruls, Eindhoven (NL); Hans Jansen, Eindhoven (NL); Antonius Johannus Van der Net, Tilburg (NL); Pieter Jacob Kramer, Veldhoven (NL); Anthonie Kuijper, Best (NL); Arjan Hubrecht Josef Anna Martens, Valkenburg (NL); Eric Willem Felix Casimiri, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 504 days.

This patent is subject to a terminal disclaimer.

(21) Appl. No.: 12/778,575

(22) Filed: May 12, 2010

(65) Prior Publication Data

US 2010/0328634 A1  Dec. 30, 2010

Related U.S. Application Data

(60) Provisional application No. 61/178,432, filed on May 14, 2009.

(51) Int. Cl.
*B60R 1/06* (2006.01)
*G03B 27/32* (2006.01)
*G03B 27/42* (2006.01)
*G03B 27/52* (2006.01)

(52) U.S. Cl.
USPC .................. 355/30; 355/53; 355/77; 359/509

(58) Field of Classification Search
USPC ........... 310/12.05–12.06; 355/30, 53, 67, 72, 355/75, 77; 359/507–514
See application file for complete search history.

(56) References Cited

U.S. PATENT DOCUMENTS

| | | | |
|---|---|---|---|
| 4,509,852 A | 4/1985 | Tabarelli et al. | |
| 7,315,033 B1 * | 1/2008 | Pawloski et al. | 250/492.2 |
| 7,528,929 B2 | 5/2009 | Streefkerk et al. | |
| 7,841,352 B2 | 11/2010 | Jansen et al. | |
| 7,900,641 B2 | 3/2011 | De Jong et al. | |

(Continued)

FOREIGN PATENT DOCUMENTS

| | | |
|---|---|---|
| EP | 1 420 300 A2 | 5/2004 |
| EP | 1 808 884 | 7/2007 |

(Continued)

OTHER PUBLICATIONS

Japanese Office Action mailed Dec. 14, 2011 in corresponding Japanese Patent Application No. 2010-107057.

(Continued)

*Primary Examiner* — Hung Henry Nguyen
*Assistant Examiner* — Colin Kreutzer
(74) *Attorney, Agent, or Firm* — Pillsbury Winthrop Shaw Pittman LLP (57) ABSTRACT

A method of cleaning an immersion lithographic apparatus is disclosed in which a cleaner is added to immersion liquid for use during exposure of a substrate. The cleaner may be a combination of a soap and a solvent. The cleaner maybe present at a concentration of less than 300 ppb.

19 Claims, 7 Drawing Sheets

(56) References Cited

U.S. PATENT DOCUMENTS

| | | |
|---|---|---|
| 8,432,531 B2 * | 4/2013 | Hoekerd et al. ............... 355/53 |
| 2004/0136494 A1 | 7/2004 | Lof et al. |
| 2004/0171171 A1 * | 9/2004 | Appoldt et al. ............... 436/180 |
| 2004/0207824 A1 | 10/2004 | Lof et al. |
| 2005/0078286 A1 * | 4/2005 | Dierichs et al. ............... 355/30 |
| 2005/0175776 A1 | 8/2005 | Streefkerk et al. |
| 2006/0038968 A1 | 2/2006 | Kemper et al. |
| 2006/0072088 A1 | 4/2006 | Lipson et al. |
| 2006/0119809 A1 | 6/2006 | Verhagen et al. |
| 2006/0158627 A1 | 7/2006 | Kemper et al. |
| 2007/0085989 A1 * | 4/2007 | Nagahashi et al. ............ 355/53 |
| 2007/0242247 A1 | 10/2007 | Shiraishi |
| 2008/0212046 A1 | 9/2008 | Riepen et al. |
| 2009/0000505 A1 | 1/2009 | Shimamura |
| 2009/0004607 A1 | 1/2009 | Shimoaoki et al. |
| 2009/0027635 A1 * | 1/2009 | De Jong et al. ............... 355/30 |
| 2009/0061331 A1 | 3/2009 | Nakano |
| 2009/0066922 A1 | 3/2009 | Nakano |
| 2009/0195761 A1 | 8/2009 | De Graaf et al. |
| 2009/0251672 A1 | 10/2009 | Nagasaka et al. |
| 2009/0279060 A1 | 11/2009 | Direcks et al. |
| 2010/0060868 A1 | 3/2010 | Tanasa et al. |
| 2010/0097587 A1 | 4/2010 | De Jong et al. |
| 2010/0110398 A1 | 5/2010 | De Graaf et al. |
| 2011/0080567 A1 * | 4/2011 | Hoekerd et al. ............... 355/30 |

FOREIGN PATENT DOCUMENTS

| | | |
|---|---|---|
| EP | 1 895 571 | 3/2008 |
| JP | 2007-242784 | 9/2007 |
| JP | 2007-258638 | 10/2007 |
| JP | 2008-060156 | 3/2008 |
| JP | 2008-227555 | 9/2008 |
| JP | 2008-277819 | 11/2008 |
| JP | 2008-283156 | 11/2008 |
| JP | 2008-288619 | 11/2008 |
| JP | 2008-294439 | 12/2008 |
| JP | 2008-300824 | 12/2008 |
| JP | 2009-033111 | 2/2009 |
| WO | 99/49504 A1 | 9/1999 |
| WO | 2005/064405 A2 | 7/2005 |
| WO | 2006/137410 | 12/2006 |

OTHER PUBLICATIONS

Office Action issued for Taiwanese Patent Application No. 099133125, dated Jul. 9, 2013.

\* cited by examiner

Fig. 1

-- PRIOR ART --

Fig. 2

-- PRIOR ART --

Fig. 3

-- PRIOR ART --

Fig. 4

-- PRIOR ART --

LITHOGRAPHIC APPARATUS AND A METHOD OF OPERATING THE APPARATUS

This application claims priority and benefit under 35 U.S.C. §119(e) to U.S. Provisional Patent Application No. 61/178,432, entitled "Lithographic Apparatus and a Method of Operating the Apparatus", filed on May 14, 2009. The content of that application is incorporated herein in its entirety by reference.

FIELD

The present invention relates to an immersion lithographic apparatus and a method of maintaining an immersion apparatus clean.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that should be accelerated during a scanning exposure. This may require additional or more powerful motors and turbulence in the liquid may lead to undesirable and unpredictable effects.

In an immersion apparatus, immersion fluid is handled by a fluid handling system, structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member maybe a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

After exposure of a substrate in an immersion lithographic apparatus, the substrate table is moved away from its exposure position to a position in which the substrate may be removed and replaced by a different substrate. This is known as substrate swap. In a two stage lithographic apparatus, the substrate tables swap may take place under the projection system.

PCT patent application publication WO 2005/064405 discloses an all wet arrangement in which the immersion liquid is unconfined. In such a system the whole top surface of the substrate is covered in liquid. This may be advantageous because then the whole top surface of the substrate is exposed to the substantially same conditions. This may have an advantage for temperature control and processing of the substrate. In WO 2005/064405, a liquid supply system provides liquid to the gap between the final element of the projection system and the substrate. That liquid is allowed to leak over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in United States patent application publication no. US 2006/0119809. A member is provided which covers the substrate W in all positions and which is arranged to have immersion liquid extending between it and the top surface of the substrate and/or substrate table which holds the substrate.

In a fluid handling system or liquid confinement structure, liquid is confined to a space, for example within a confinement structure by the body of the structure, the underlying surface (e.g. a substrate table, a substrate supported on the substrate table, a shutter member and/or a measurement table)

and, in the case of a localized area immersion system, a liquid meniscus between the fluid handling system or liquid confinement structure and the underlying structure i.e. in an immersion space. In the case of an all wet system, liquid is allowed to flow out of the immersion space onto the top surface of the substrate and/or substrate table.

SUMMARY

There is a need to address the problem of contamination in a lithographic apparatus. Contamination may, for example, be generated by removal of particles of top-coat material, resist or both and/or future process materials including BARC. There are different types of contamination and the degree to which the lithographic apparatus should be cleaned and the type of cleaner that should be used may depend on the type of contamination that is present. Current cleaning systems and cleaning methods do not allow for in-line cleaning, for example during normal operation of the apparatus. Operation, and even completion, of a cleaning process may require a special cleaning process during which the apparatus is not operating or normal operation does not occur. Such modes of operation, and thus cleaning of the lithographic apparatus, may occur during 'down time'. A cleaning process and completion of this process may cause significant down time of the apparatus.

It is therefore desirable, for example, to provide a system to reduce contamination in a lithographic apparatus or to clean a lithographic apparatus in which the downtime for, for example, cleaning is reduced if not eliminated.

In an aspect, there is provided an immersion lithographic apparatus comprising: a projection system; a liquid confinement structure configured at least partly to confine immersion liquid to an immersion space defined by the projection system, the liquid confinement structure and a substrate and/or substrate table; a liquid supply device comprising a first liquid source, a second liquid source comprising a source of an active cleaning agent, a mixer configured to mix liquid from the first liquid source with liquid from the second liquid source, and a conduit configured to provide mixed liquid from the mixer to the liquid confinement structure; and a controller configured to control supply of mixed liquid, comprising liquid from the first source and liquid from the second source, from the liquid supply device to the liquid confinement structure during impingement of a beam of radiation from the projection system through immersion liquid on a substrate.

In an aspect, there is provided a method of maintaining an immersion apparatus clean, wherein a soap or a soap and a solvent are added to immersion liquid passing through the apparatus during exposure of a substrate to radiation.

In an aspect, there is provided a method of maintaining an immersion apparatus clean, wherein an additive is added in a quantity of less than 300 ppb to immersion liquid passing through the apparatus during exposure of a substrate to radiation.

In an aspect, there is provided a fluid supply apparatus configured to supply a dilute cleaning fluid to an immersion lithographic apparatus, the fluid supply apparatus comprising an immersion liquid supply, a cleaning fluid supply, a mixer configured to mix the cleaning fluid and the immersion liquid to a dilute mixture, a sensor configured to sense a concentration of the cleaning fluid in the dilute mixture and a controller connected to the sensor and the mixer, the controller configured to control: the supply of the cleaning fluid supplied from the cleaning fluid supply to the mixer; and the concentration of the cleaning fluid in the dilute mixture.

In an aspect, there is provided a fluid handling structure configured to supply and confine immersion liquid to a space defined between a projection system and a surface facing the fluid handing structure, the facing surface comprising a surface of a substrate and/or a substrate table configured to support the substrate, wherein: the fluid handling structure has an immersion liquid supply opening configured to supply immersion liquid to the space, and a cleaning liquid supply opening configured to supply cleaning liquid to a space between the confinement structure and the facing surface.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
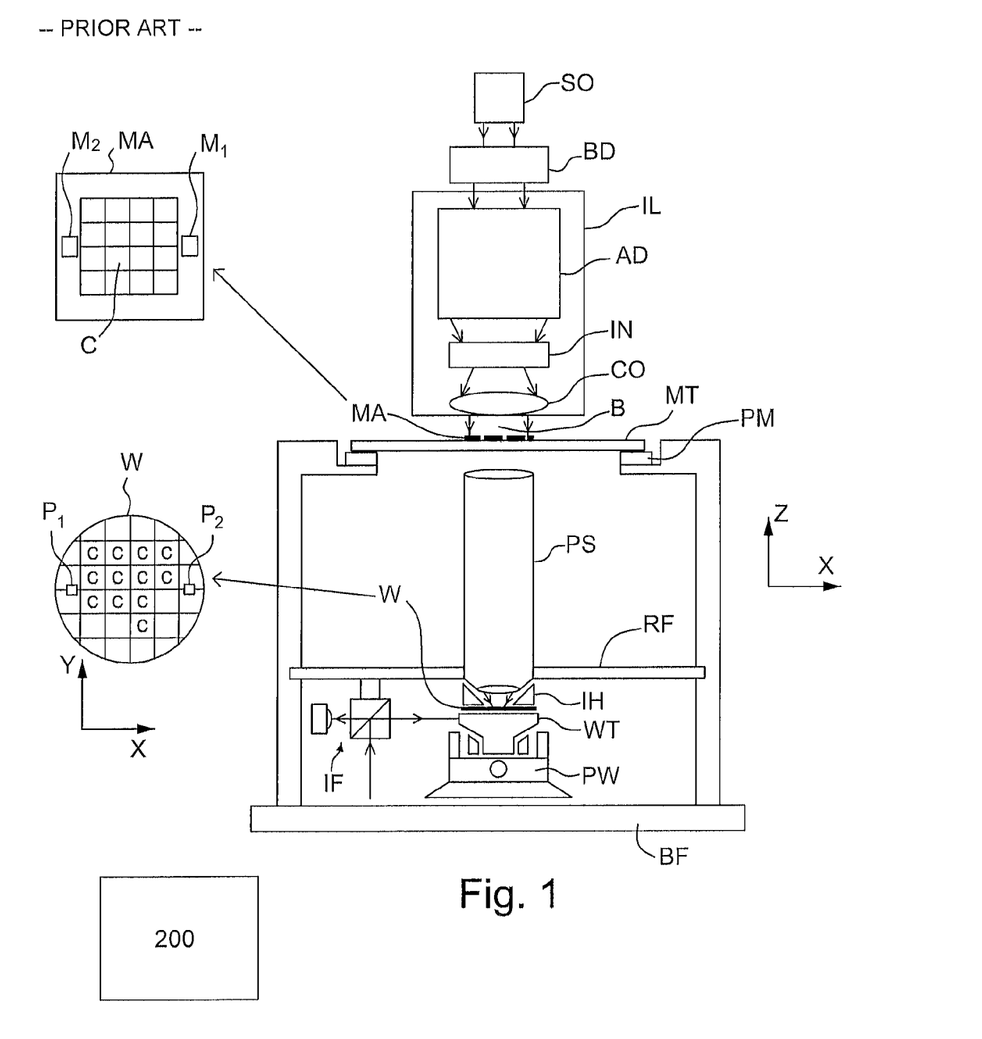
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device MA in accordance with certain parameters;

a substrate table (e.g. a wafer table) WT constructed to hold a substrate (e.g. a resist-coated wafer) W and connected to a second positioner PW configured to accurately position the substrate W in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. The support structure MT holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a Frame or a table, for example, which may be fixed or movable as desired. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system. The types of projection system may include: refractive, reflective, catadioptric, magnetic, electromagnetic and electrostatic optical systems, or any combination thereof. The selection or combination of the projection system is as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source SO and the lithographic apparatus may be separate entities, for example when the source SO is an excimer laser, in such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS. The projection system PS focuses the beam B onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (line positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W maybe aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

In another mode, the support structure MT is kept essentially stationary holding a programmable patterning device, and the substrate table WT is moved or scanned while a pattern imparted to the radiation beam B is projected onto a target portion C. In this mode, generally a pulsed radiation source is employed and the programmable patterning device is updated as desired alter each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In an arrangement a liquid supply system may provide liquid on only a localized area of an underlying surface, which may be a substrate and/or substrate table. The liquid may be confined between the final optical element of the projection system and the underlying surface, such as a substrate (the substrate generally has a larger surface area than the final optical element of the projection system), using a liquid confinement system.

An arrangement to provide liquid between a final element of the projection system PS and the substrate is the so called localized immersion system IH. In this system a liquid handling system is used in which liquid is only provided to a localized area of the substrate. The space filled by liquid is smaller in plan than the top surface of the substrate and the area filled with liquid remains substantially stationary relative to the projection system PS while the substrate W moves underneath that area. Four different types of localized liquid supply systems are illustrated in FIGS. 2-5.

Figure 2:
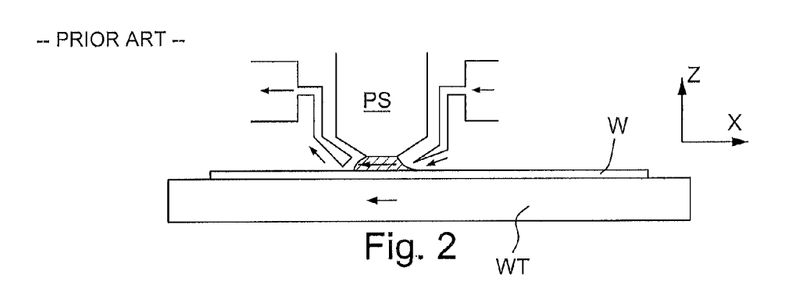
FIGS. 2 and 3 depict a fluid handling structure as a liquid supply system for use in a lithographic projection apparatus.
Figure 3:
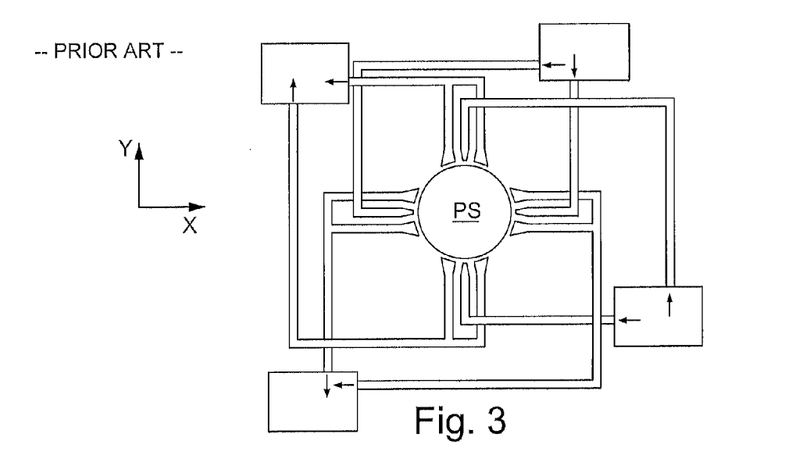

One way which has been proposed to arrange for this is disclosed in PCT patent application publication no. WO 99/49504. As illustrated in FIGS. 2 and 3, liquid is supplied by at least one inlet onto the substrate, preferably along the direction of movement of the substrate relative to the final element. Liquid is removed by at least one outlet after having passed under the projection system. That is, as the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. In the illustration of FIG. 2 the liquid is supplied along the direction of movement of the substrate relative to the final element, though this does not need to be the case. Various orientations and numbers of in- and out-lets positioned around the final element are possible; one example is illustrated in FIG. 3 in which four sets of an inlet with an outlet on either side are provided in a regular pattern around the final element. Note that the direction of flow of the liquid is shown by arrows in FIGS. 2 and 3.

Figure 4:
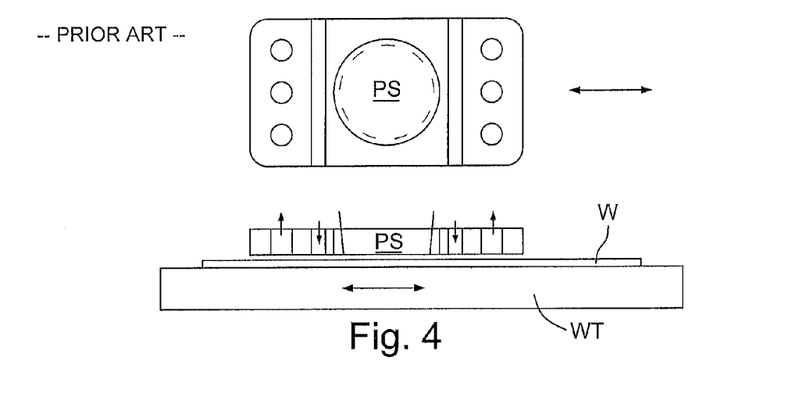
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets and outlets can be arranged in a plate with a hole in its centre and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). Note that the direction of flow of the liquid is shown by arrows in FIG. 4.

Figure 5:
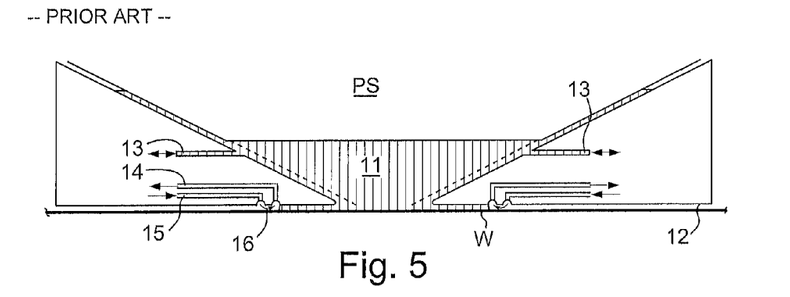
FIG. 5 depicts, in cross-section, a liquid confinement structure which may be used in an embodiment of the present invention as a liquid supply system.

Another arrangement which has been proposed is to provide the liquid supply system with a liquid confinement member which extends along at least a part of a boundary of the space between the final element of the projection system and the substrate table. Such an arrangement is illustrated in FIG. 5. The immersion system has a localized liquid supply system with a liquid confinement structure, which supplies liquid to a limited area of, for example, a substrate. The liquid confinement structure extends along at least part of a boundary of the space between the final element of the projection system and the underlying surface of the substrate, substrate table or both. (Please note that reference in the following text to the surface of the substrate also refers in addition or in the alternative to a surface of the substrate table, unless expressed otherwise). The liquid confinement member is substantially stationary relative to the projection system in the XY plane though there maybe some relative movement in the Z direction (in the direction of the optical axis). In an embodiment a seal is formed between the liquid confinement structure 12 and the surface of the substrate W. The seal may be a contactless seal such as a fluid seal such as a gas seal or a capillary force seal. Such a system is disclosed in United States patent application publication no. US 2004-0207824, hereby incorporated in its entirety by reference.

The liquid confinement structure 12 at least partly contains liquid in the immersion space 11 between a final clement of the projection system PS and the substrate W. A contactless seal 16 to the substrate W may be formed around the image field of the projection system so that liquid is confined within the space between the substrate W surface and the final element of the projection system PS. The immersion space is at least partly formed by the liquid confinement structure 12 positioned below and surrounding the final element of the projection system PS, Liquid is brought into the space below the projection system and within the liquid confinement structure 12 by liquid inlet 13. The liquid maybe removed by liquid outlet 13. The liquid confinement structure 12 may extend a little above the final element of the projection system. The liquid level rises above the final element so that a buffer of liquid is provided. In an embodiment, the liquid confinement structure 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

In an embodiment, the liquid is contained in the immersion space 11 by a gas seal 16 which, during use, is formed between the bottom of the barrier member 12 and the surface of the substrate W. Other types of seal, such as a seal dependent on capillary forces and meniscus pinning, are possible, as is no seal (for example in an all wet embodiment). The gas seal is formed by gas, e.g. air or synthetic air but, in an embodiment, N2 or another inert gas. The gas in the gas seal is provided under pressure via inlet 15 to the gap between liquid confinement structure 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the liquid confinement structure 12 and the substrate W contains the liquid in an immersion space 11. lire inlets/outlets may be annular grooves which surround the space 11. The annular grooves may be continuous or discontinuous. The flow of gas 16 is effective to contain the liquid in the space 11. Such a system is disclosed in United States patent application publication no. US 2004-0207824.

Other arrangements are possible and, as will be clear from the description below, an embodiment of the present invention may use any type of localized liquid supply system as the liquid supply system.

Figure 6:
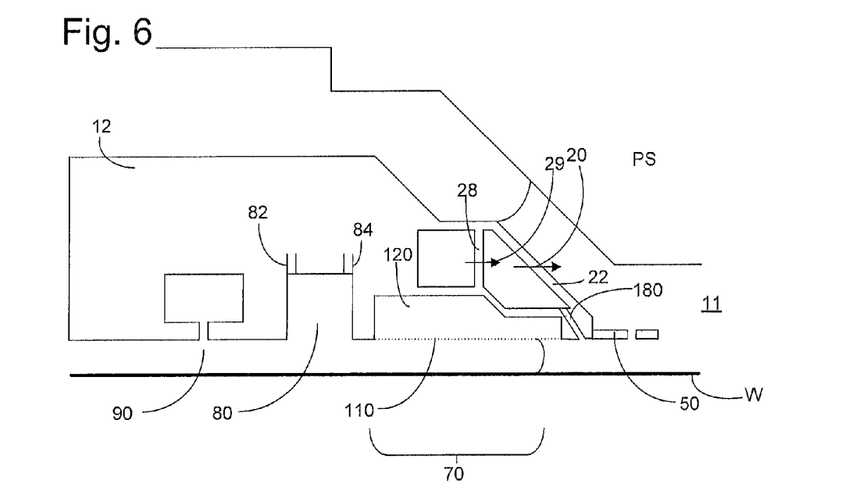
FIG. 6 depicts, in cross-section, a liquid confinement structure and projection system according to an embodiment of the invention.

FIG. 6 illustrates a liquid confinement structure 12 which is part of a liquid supply system. The liquid confinement structure 12 extends around the periphery (e.g., circumference) of the final clement of the projection system PS.

The function of the liquid confinement structure 12 is at least partly to maintain or confine liquid in the space 11 between the projection system PS and the substrate W so that the projection beam may pass through the liquid.

A plurality of openings 20 in the surface which defines the space 11 provide the liquid to the space 11. The liquid passes through openings 29, 20 in side walls 28, 22 respectively prior to entering the space 11.

A seal is provided between the bottom of the liquid confinement structure 12 and the substrate W. In FIG. 6 a seal device is configured to provide a contactless seal and is made up of several components. Radially outwardly from the optical axis of the projection system PS, there is provided a (optional) flow control plate 50 which extends into the space 11. Radially outwardly of the flow control plate 50 on the bottom surface of the liquid confinement structure 12 facing the substrate W or substrate table WT may be an opening 180. The opening 180 can provide liquid in a direction towards the substrate W. During imaging this may be useful in preventing bubble formation in the immersion liquid by filling a gap between the substrate W and substrate table WT with liquid.

Radially outwardly of the opening 180 may be an extractor assembly 70 to extract liquid from between the liquid confinement structure 12 and the substrate W and/or the substrate table WT. The extractor assembly 70 may operate as a single phase or as a dual phase extractor.

Radially outwardly of the extractor assembly 70 may be a recess 80. The recess 80 is connected through an inlet 82 to the atmosphere. The recess 80 is connected via an outlet 84 to a low pressure source. Radially outwardly of the recess 80 may be a gas knife 90. An arrangement of the extractor assembly, recess and gas knife is disclosed in detail in United States patent application publication no. US 2006/0158627 incorporated herein in its entirety by reference.

The extractor assembly 70 comprises a liquid removal device or extractor or inlet such as the one disclosed in United States patent application publication no. US 2006-0038968, incorporated herein in its entirety by reference. In an embodiment, the liquid removal device 70 comprises an inlet which is covered in a porous material 110 which is used to separate liquid from gas to enable single-liquid phase liquid extraction. An under pressure in chamber 120 is chosen is such that the meniscuses formed in the holes of the porous material 110 prevent ambient gas from being drawn into the chamber 120 of the liquid removal device 70. However, when the surface of the porous material 110 comes into contact with liquid there is no meniscus to restrict flow and the liquid can flow freely into the chamber 120 of the liquid removal device 70.

The porous material 110 has a large number of small holes each with a dimension, e.g. a width, such as a diameter, $d_{hole}$ in the range of 5 to 50 µm. The porous material 110 may be maintained at a height in the range of 50 to 300 µm above a surface from which liquid is to be removed, e.g. the surface of a substrate W. in an embodiment, porous material 110 is at least slightly liquidphilic, i.e. having a dynamic contact angle of less than 90°, desirably less than 85° or desirably less than 80°, to the immersion liquid, e.g. water.

Although not specifically illustrated in FIG. 6, the liquid supply system has an arrangement to deal with variations in the level of the liquid. This is so that liquid which builds up between the projection system PS and the liquid confinement structure 12 can be dealt with and does not spill. One way of dealing with this liquid is to provide a liquidphobic (e.g., hydrophobic) coating. The coating may form a band around the top of the liquid confinement structure 12 surrounding the opening and/or around the last optical element of the projection system PS. The coating may be radially outward of the optical axis of the projection system PS. The liquidphobic (e.g., hydrophobic) coating helps keep the immersion liquid in the space 11.

The examples of FIGS. 5 and 6 are a so called localized area arrangement in which liquid is only provided to a localized area of the top surface of the substrate W at any one time. Other arrangements are possible, including fluid handling systems which make use of a gas drag principle. The so-called gas drag principle has been described, for example, in United States patent application publication no. US 2008-0212046 and United States patent application publication no. US 2009-0279060. In that system the extraction holes are arranged in a shape which desirably has a corner. The corner may be aligned with the stepping and scanning directions. This reduces the force on the meniscus between two openings in the surface of the fluid handing structure for a given speed in the step or scan direction compared to if the two outlets were aligned perpendicular to the direction of scan. An embodiment of the invention may be applied to a fluid handling structure used in all wet immersion apparatus. In the all wet embodiment, fluid is allowed to cover substantially the whole of the top surface of the substrate table, for example, by allowing liquid to leak out of a confinement structure which confines liquid to between the final element of projection system and the substrate. An example of a fluid handling structure for an all wet embodiment can be found in United States patent application publication no. US 2010-0060868.

An embodiment of the present invention will be described with reference to a liquid confinement structure 12 with the above mentioned structure. However, it will be apparent that any other type of liquid confinement structure or liquid handling system which provides liquid to an immersion space between the final element of the projection system PS and a substrate W may be applied in an embodiment of the invention. A liquid confinement structure or fluid handling system of both a localized area immersion lithographic apparatus and an all wet arrangement may be applied in an embodiment of the invention.

In the lithographic apparatus, contamination of one or more of the surfaces, for example a surface of the immersion space, such as a surface of the immersion hood and/or of the substrate table WT, can build up over time if not removed. Such contamination may include flake from top coat particles and/or flakes from the resist. The flakes generally comprise a substituted acrylic polymer, such as a fluorinated polymethylmethacrylate resin. A cleaning fluid maybe supplied to a surface in order to remove the contamination present.

An embodiment of the invention is intended to help solve the problem of contamination in an immersion lithographic apparatus. Such contamination can not only result in defects in the substrate but can also lead to a loss in performance of the liquid confinement structure 12, for example when the porous material 110 of the liquid removal device 70 becomes blocked with contamination. This can lead to the seal between the liquid confinement structure 12 and the substrate W and/or substrate table WT breaking down and resulting in undesirable loss of liquid.

U.S. patent application publication no. US 2009-0195761 and U.S. patent application publication no. US 2010-0097587 relate to deeming solutions which maybe used in an immersion lithographic apparatus and to typical cleaning schedules.

In U.S. patent application publication no. US 2009-0195761, a cleaning schedule is disclosed in which the lithographic apparatus does not need to be dissembled in order for cleaning to occur. U.S. patent application publication no. US 2010-0097587 relates to a cleaning fluid and in particular to a cleaning fluid which does not deleteriously affect components of the lithographic apparatus.

That said, it is possible to use an additive (e.g. an active cleaning agent) in immersion liquid during imaging of a substrate to clean and/or prevent contamination built-up. The prevention in contamination can be achieved at the same time as maintaining high transmittance of the immersion liquid (in one embodiment ultra pure water) and without damaging components of the lithographic apparatus. In one embodiment the additive added to the immersion liquid is present at a concentration of 1 ppm or less, 500 ppb or less, 300 ppb or less, desirably 200 ppb or less, more desirably less than 100 ppb and most desirably less than 50 ppb. In one embodiment the concentration may be less than 20 ppb, for example 10 ppb. As used herein, ppb is expressed in terms of mass fraction. The cleaner of an embodiment of the present invention may be the same as or similar to any of the cleaners described in U.S. patent application publication no. US 2009-0195761 and U.S. patent application publication no. US 2010-0097587 at the concentrations described herein.

In one embodiment the immersion lithographic apparatus itself mixes liquids from first and second liquid sources. The first liquid source may be a normal immersion liquid source (for example a source of ultra pure water) and the second liquid source is the source of an addition (e.g. a cleaner) which is mixed into the liquid from the first liquid source. Further liquid sources may be provided with further additives.

In an embodiment, at least one of the second or further sources may include an additive, such as a surfactant, a detergent, soap, an acid, an alkaline, a solvent (such as a non-polar organic solvent or a polar organic solvent), any other suitable cleaner for the lithographic apparatus, or any combination of the above. A desirable additive is a surfactant. Another desirable addition is a soap. Another desirable additive is a solvent. A combination of a soap and a solvent is particularly desirable. The cleaner may include diethylene glycol monobutyl ether and/or ethoxylated secondary C12-14-alcohol, e.g. aldyloxypolyethyleneoxyethanol. In an embodiment, the cleaner maybe a mixture of water, diethylene glycol monobutyl ether, and ethoxylated secondary C12-14-alcohol, such as TLDR-A001 or TLDR-A001-C4, which are manufactured by Tokyo Ohko Kogyo Co., Ltd.

In an embodiment, the cleaner may include water, a solvent selected from one or more glycol ethers, esters, alcohols and ketones, and a surfactant. In an embodiment, the water is clean, for example the water may be ultra-pure water. The solvent should be chosen to have a reasonable match with the contamination that is to be removed. This can be determined, for example, using the Hansen theory (see, for example, Hansen Solubility Parameters, Charles M. Hansen, $2^{nd}$ edition, CRC press, ISBN 0-8493-7248). Typically, the solvent will have a match, determined using the Hansen theory, of at least 50% (i.e. it will be positioned near the center of the Hansen solubility sphere). The solvent used will also in general be completely mixable in water. In an embodiment, the solvent may have a solubility of more than 10 wt % in water. In an embodiment, the solvent may have a flash point above 38° C., for example above 70° C. or above 93° C.

A glycol ether for use in the cleaning fluid may include a propylene glycolether, such as propylene glycol methyl ether (PGME), dipropylene glycol methyl ether (DPGME), tripropylene glycol methyl ether (TPGME), propylene glycol ethyl ether (PGEE), propylene glycol normal propyl ether (PGPE), dipropylene glycol normal propyl ether (DPGPE), propylene glycol normal butyl ether (PGBE), dipropylene glycol normal butyl ether (DPGBE), tripropylene glycol normal butyl ether (TPGBE) or propylene glycol tertiary butyl ether (PGTBE); an ethylene glycolether, such as diethylene glycol methyl ether (DEGME), diethylene glycol ethyl ether (DEGEE), diethylene glycolpropyl ether (DEGPE), ethylene glycol butyl ether (EGBE) or diethylene glycol butyl ether (DEGBE); a propylene glycol ether acetate, such as propylene glycol methyl ether acetate (PGMEA) or dipropylene glycol methyl ether acetate (DPGMEA), or an ethylene glycol ether acetate, such as ethylene glycol butyl ether acetate (EGBEA) or diethylene glycol butyl ether acetate (DEGEA). In an embodiment, the glycol ether may be selected from DEGBE, DEGPE, PGME and DPGME. In an embodiment, the glycol ether is DEGBE.

An ester for use in the cleaning fluid may include a compound which has an ester functionality. Suitable compounds include methyl lactate, ethyl lactate, propyl lactate, butyl lactate, gamma butyrolactone, methyl acetate, ethyl acetate, propyl acetate, butyl acetate, isobutyl acetate, t-butyl acetate or gamma butyrol acetate. In an embodiment, the ester is a dibasic ester. In an embodiment, the ester is ethyl lactate or butyrolactate.

A ketones for use in the cleaning fluid may include cyclohexanone or diacetone alcohol.

An alcohol for use in the cleaning fluid may include methanol, ethanol, propanol (such as isopropanol), t-butyl alcohol, 4-methyl-2-pentanol or cyclohexanol.

In an embodiment, the solvent is selected from one or more glycol ethers or esters. In one embodiment, the solvent is selected from one or more glycol ethers.

In an embodiment, the solvent is selected from DEGBE or ethyl lactate. In an embodiment, the solvent is DEGBE.

In an embodiment, the surfactant is selected from one or more nonionic, cationic or anionic surfactants. In an embodiment, the surfactant is selected from one or more nonionic surfactants. In an embodiment, the surfactant comprises a nonionic surfactant which is an ethylene oxide/propylene oxide block copolymer with a molecular weight from 1000 to 3000. A suitable such surfactant is Pluronic® L61 from BASF. In an embodiment, the surfactant comprises a defoaming wetting agent such as Envirogen® AD01 from Air Products.

In an embodiment, the additive may further comprise a pH adjustment chemical. If present, the pH adjustment can be used to help ensure that the pH of the cleaning fluid is from 7 to 10, for example from 8 to 10 or from 9 to 10. A suitable pH adjustment chemical may include an inorganic base such as sodium hydroxide, potassium hydroxide or a phosphate buffer. Increasing the pit of the solution can decrease the adhesive forces between the contaminant and the surface and may therefore result in more efficient cleaning. However, increasing the pH beyond 10 should in general be avoided since this may lead to damage to parts of the lithographic apparatus, for example an optical element of the projection system.

In an embodiment, the additive(s) maybe free from nitrogen containing compounds. In an embodiment, the cleaning fluid may be free from ammonia and amines. These compounds are volatile alkalines and may adversely affect the processing of the photo resist.

Solvents are generally considered to remove contamination mainly by chemical dissolution.

In one embodiment, the additive is TLDR-A001 or TLDR-A001-C4.

In one embodiment, the additive is a mixture of a soap and a solvent. In one embodiment, the additive includes a surfactant.

In one embodiment, the additive comprises a glycol ether, an ester, an alcohol and/or a ketone.

In one embodiment, the additive comprises a top coat cleaner. The top coat cleaner may include a top coat remover.

If the additive is a surfactant, this reduces the chance of particles sticking to a wetted surface (like the porous member 110). Therefore, the particles can be flushed away into the extraction system.

Figure 7:
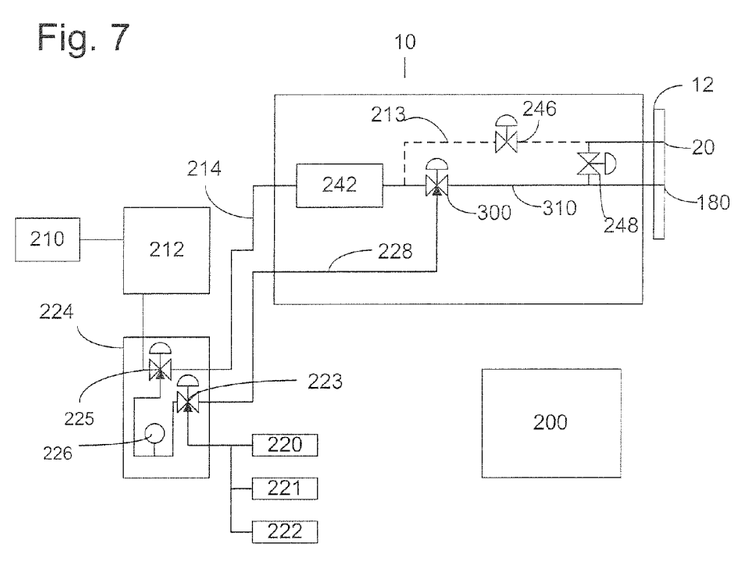
FIG. 7 depicts schematically a liquid supply device.
Figure 8:
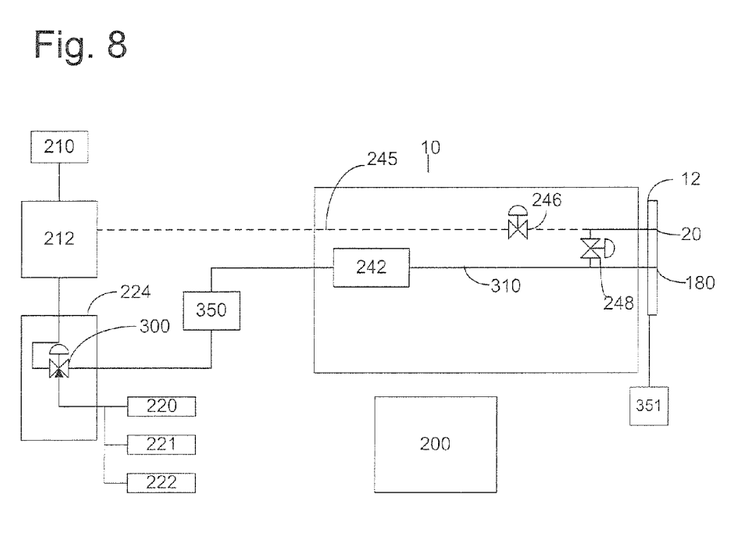
FIG. 8 depicts schematically a further embodiment of a liquid supply device.

FIGS. 7 and 8 illustrate schematically embodiments of a liquid supply device 10 of an immersion lithographic apparatus according to an embodiment of the present invention. FIG. 7 illustrates an embodiment in which a conventional immersion liquid supply 212 and a cleaner supply 224 are in parallel. FIG. 8 illustrates an embodiment in which the conventional immersion liquid supply 212 and the cleaner supply 224 are in series. The cleaner supply 224 can be retrofitted to an existing immersion lithographic apparatus which comprises a conventional immersion liquid supply 212.

Figure 9:
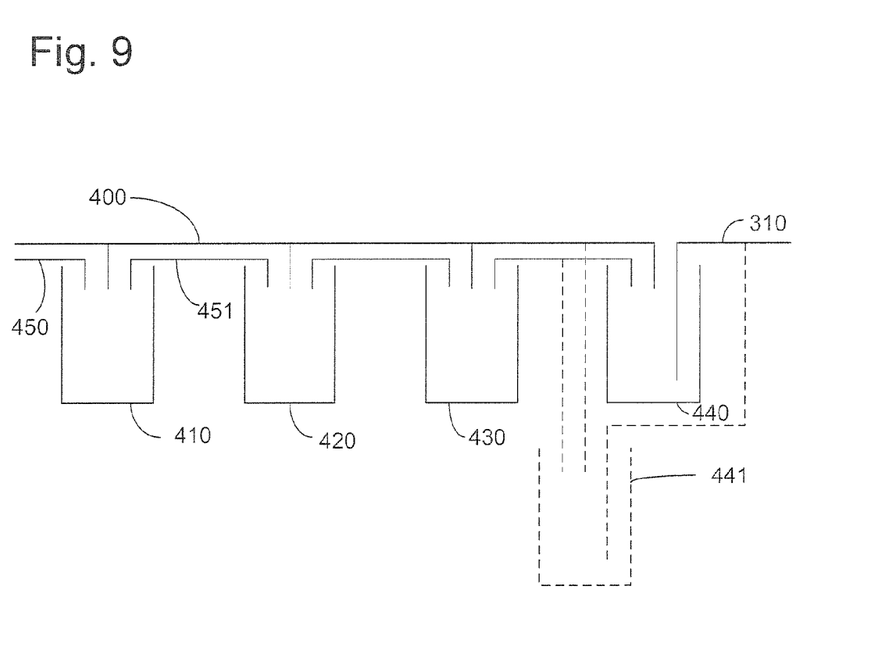
FIG. 9 depicts schematically a mixer.
Figure 10:
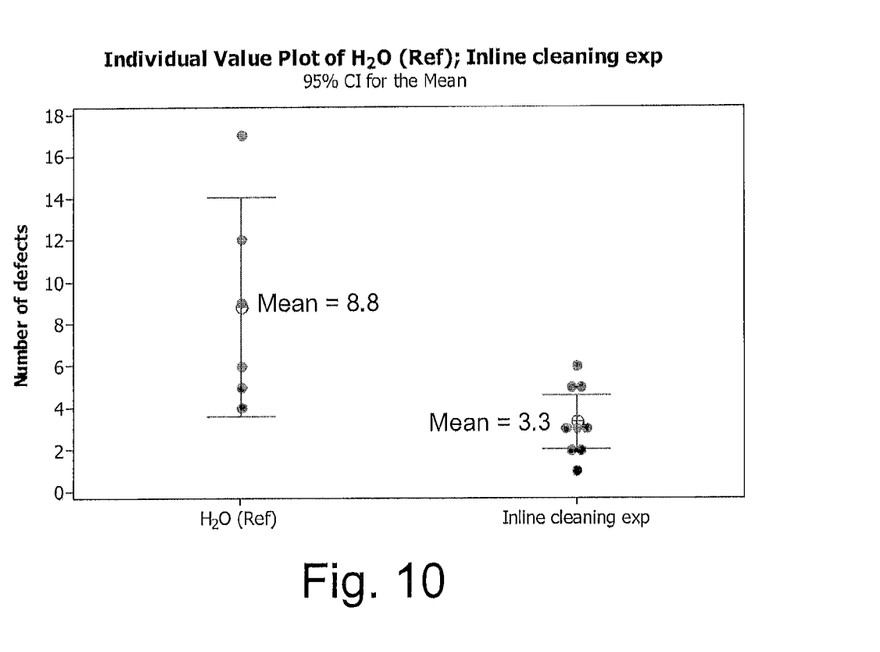
FIG. 10 illustrates experimental results showing the impact of an embodiment of the present invention on the number of defects.

FIG. 9 illustrates one embodiment of a mixer which can be used to achieve the very low concentration of additive in immersion liquid in some embodiments of the present invention. FIG. 10 illustrates the average total defects which appear in a conventional immersion lithographic apparatus which does not include an embodiment of the present invention and in apparatuses which include an embodiment of the present invention and apply additive in different concentrations.

FIG. 7 illustrates components of an immersion lithographic apparatus under the control of a controller 200. The controller 200 controls the apparatus such that the liquid supply device 10 mixes immersion liquid with at least one additive during impingement of a projection beam PB of radiation from the projection system PS through immersion liquid onto a substrate W.

The liquid supply device 10 comprises a first liquid source 210. The first liquid source 210 typically provides immersion liquid, for example ultra pure water. The first liquid source itself may connected to source of the immersion liquid, for example a supply of ultra pure water in the fab. A second liquid source 220 is also provided which is a source of an additive. The second liquid source itself may connected to source of the additive, for example a container of additive in the fab. The additive from the second liquid source 220 may be of only one type of additive, may be a dilute solution of an additive, may be a mixture of two or more types of additive or may be a solution of two or more types of additive as described above. Third and fourth further liquid sources 221, 222 may also be provided. The further liquid sources 221, 222 may comprise other additives which can be mixed selectively under control of controller 200 into the immersion liquid. The additives in the further liquid sources 221, 222 maybe any of those described above.

Liquid from the first liquid source 210 is provided to the immersion liquid supply 212 which regulates the supply. From the immersion liquid supply 212, immersion liquid is supplied via a conduit to the cleaner supply 224. Here a regulator 225 regulates the flow of immersion liquid from the first liquid source 210 to a conditioning unit 242. In an embodiment, the conditioning unit 242 comprises one or more filters, heat exchangers, etc. to condition the immersion liquid.

Regulator 225 provides immersion liquid to an injection point 223. At point 223 liquid from the second liquid source 220 and/or further liquid sources 221, 222 is added to immersion liquid from the first liquid source 210.

In an embodiment, a flow regulator 226 is employed to regulate the flow of immersion liquid to the injection point 223. Additive from at least one of the liquid sources 220, 221, 222 diluted in immersion liquid then passes along conduit 228 to a mixer 300.

Immersion liquid from the conditioning unit 242 is passed to the mixer 300. The two liquids are mixed at mixer 300 under the control of controller 200. An embodiment of the injection point 223 and/or mixer 300 will be described with reference to FIG. 9.

A conduit 310 leads from the mixer 300 to the liquid confinement structure 12. In this way immersion liquid which has had an additive from the second liquid source 220 and/or further liquid source 221, 222 added is provided to the liquid confinement structure 12.

In one embodiment liquid with additive is only provided to an opening 180 defined in an undersurface of the liquid confinement structure 12 which faces the substrate W on substrate table WT. In another embodiment, immersion liquid which has had additive added may also be provided to an opening 20 into the immersion space 11 through which the projection beam PB projects. For this purpose a valve 248 may be provided to regulate flow.

In an embodiment illustrated in dotted lines, a further conduit 213 may be provided. The further conduit 213 supplies immersion liquid which has not been mixed with liquid from the second liquid source 220 or a further liquid source 221, 222 to the liquid confinement structure 12. A regulator 246 may be used to control such supply. This supply of immersion liquid in parallel to the liquid with additive may be for exiting out of the (immersion liquid supply) opening 20. This may be advantageous because then liquid through which the projection beam PB passes will not have any additive in it. Thus, the transmittance of the projection beam PB will not be reduced at all by the additive. Additionally or alternatively, the risk of carbon depositing on the final element of the projection system may be mitigated. In this embodiment the liquid which does have the additive will be the liquid which is likely to come into contact with the porous member 110 which is the member most susceptible to contamination. In one embodiment the liquid confinement structure 12 is configured to help ensure that the two types of liquid exiting openings 20 and 180 remain substantially separated.

FIG. 8 illustrates an embodiment which is the same as the embodiment of FIG. 7 except as described below. In the embodiment of FIG. 8 the immersion liquid supply 212 and cleaner supply 224 are in series. The additive from the second and/or further liquid sources 220, 221, 222 is mixed by mixer 300 in the cleaner supply 224. A single conduit 310 exits the cleaner supply 224 into the liquid conditioner 242.

An optional conduit 245 may be provided which is similar to the conduit 213 of the FIG. 7 embodiment. The conduit 245 may optionally have a liquid conditioner similar to conditioner 242. A regulator 246 may be used to control supply through conduit 213 to the liquid confinement structure.

Also illustrated in FIG. 8 is an embodiment of how to control the additive concentration. This may be achieved by providing a detector 350, 351 to detect concentration of the additive in the immersion liquid at a desired location. One location of a detector 350 may be between the mixer 300 and the liquid conditioner 242. An additional or alternative location may be just upstream of the liquid confinement structure 12 or at the liquid confinement structure 12 itself. In both cases results of the signals from the detector(s) 350, 351 is sent to the controller 200 which adjusts the mixer 300 accordingly.

In one embodiment a safety feature is provided to stop supply of immersion liquid with additive if the additive concentration is detected to be too high. For this a sensor such as detector 350, 351 may be provided.

FIG. 9 illustrates one embodiment of an injection point 223 or of a mixer 300. Because of the low concentration of additive in immersion liquid required (lower than 300 ppb) it can be difficult simply continually to meter a low flow rate of additive into a line of flowing immersion liquid. Furthermore, it may not be practical to supply a single fluid source of immersion liquid pre-mixed with additive because of the large amount of liquid used by the apparatus.

In FIG. 9 a line 400 in fluid communication with the first liquid source 210 is provided. Liquid from the first liquid source 210 maybe metered into first, second, third and fourth reservoirs 410, 420, 430, 440. Liquid from the second liquid source 220 (and/or a further liquid source 221, 222) can be metered through conduit 450 into the first reservoir. By metering a large amount of liquid from the first liquid source 210 into the reservoir 410 compared to the amount of liquid from the second or further liquid source 220, 221, 222 through conduit 450 into reservoir 410 a low concentration of liquid from the second or further liquid source 220, 221, 222 in liquid from the first liquid source 210 can be achieved in reservoir 410.

Once the first reservoir 410 is sufficiently filled, liquid from the first reservoir 410 may be metered via conduit 451 into the second reservoir 420. Liquid from the first liquid source may also be metered into second reservoir 420 via conduit 400. By ensuring that the amount of liquid from the first liquid source 210 is far greater than the amount of liquid from the first reservoir 410, the concentration of additive in the second reservoir 420 may be made much lower than the concentration of additive in the first reservoir 410.

A similar process may be repeated with the third 430 and fourth 440 reservoirs by metering from the second reservoir 420 into the third reservoir 430 and from the third reservoir 430 into the fourth reservoir 440. Liquid from the fourth reservoir 440 will then be of a very low but accurately determined concentration and can be provided via conduit 310 from the mixer 223, 300 to the liquid confinement structure 12.

This system works by first filling the first reservoir 410 which will contain liquid for a long time before needing replenishing. The second reservoir 420 will be replenishing more quickly than the first reservoir 410 as will the third and fourth reservoirs 430, 440 in turn. Any number of reservoirs can be used in this way. A desired number is at least two. The liquid from the second or further liquid source 220, 221, 222 may already be in dilute form.

In order to help ensure continuous operation, a further e.g. final reservoir may be provided (the fourth reservoir 441 in FIG. 9). The further reservoir 441 may be provided with liquid from the first liquid supply 210 through conduit 400 and with liquid from the third reservoir 430 while liquid from the fourth reservoir 440 is being supplied to the liquid confinement structure 12. When the fourth reservoir 440 is empty, the supply of liquid to the liquid confinement structure 12 may continue uninterrupted from the further reservoir 441. During this period the fourth reservoir 440 may be filled up again ready to be used when the further reservoir is used up.

Experiments have been conducted that suggest that using TLDR-A001 or TLDR-A001-C4 at a concentration of less than 1 ppm, desirably less than 500 ppb or 300 ppb, more desirably less than 200 ppb, or less than 100 ppb and down to 10 ppb or lower during exposure of a substrate (and other normal operation of the apparatus when the liquid confinement structure 12 is filled with immersion liquid) may be advantageous. The results show that this significantly reduces the amount of contamination observed. Furthermore, at these low concentrations no deleterious effects on components of the immersion apparatus are observed. Finally, this low level of total organic content (TOC) does not appear to significantly affect the transmittance of the immersion liquid or to lead to a build up of carbon on the final element of the projection system. These concentration levels during normal use strike a balance between causing contamination themselves (e.g. carbon deposit on the optics), loss of transmittance and cleaning function. As a result, less or no downtime is needed compared to conventional cleaning methods.

FIG. 10 shows how an embodiment of the present invention can reduce the number of defects produced during imaging of substrates. The results on the left hand side of the graph are for an immersion apparatus using ultra pure water only as the immersion liquid. As can be seen, the defects range between about 4 and 17 per substrate with a mean of 8.8. A 95% confidence interval is shown. On the right hand side of the graph the same experiments have been carried out but with various quantities of TLDR-A0001 between 500 and 10 ppb added to the ultra pure water. As can be seen, the number of defects per substrate ranges from 1 to 6 with a mean of 3.3. Therefore, it can be seen that by adding the additive at such low quantities, a beneficial effect in terms of reduced defects is achieved.

Figure 11:
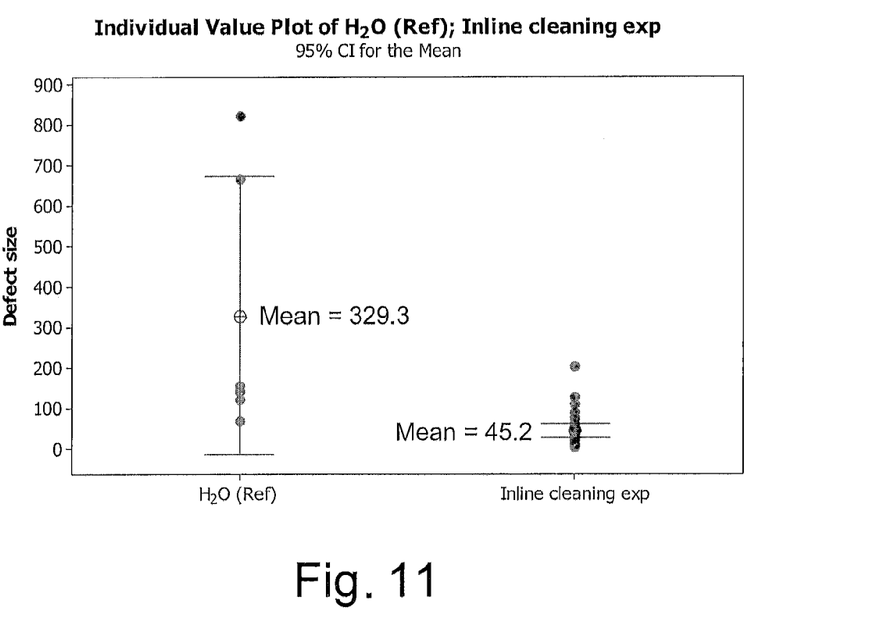
FIG. 11 illustrates experimental results showing the impact of an embodiment of the present invention on the size of defects.

FIG. 11 is for the same set of data as FIG. 10 except that it relates to the defect size. As can be seen, the size of the defects using an additive is reduced over the size of defects when no additive is used.

Figure 12:
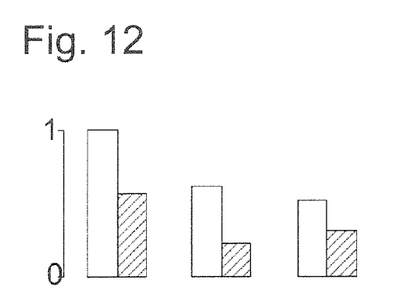
FIG. 12 illustrates experimental results showing the effect of additive concentration on number of defects.

FIG. 12 shows a graph of the average number of defects for three separate tests with 95% confidence interval shown. The non cross-hatched bars relate to the situation where the substrate has no top coat and the cross-hatched bars relate to the situation where the substrate has a top coat. The left hand most test relates to the situation where ultra pure water alone is used. The other two tests relate to the situation where an additive has been added. Those results are normalized to the results of the ultra pure water alone test. The middle test relates to where TLDR-A0001 is added at a level of 10 ppb and the right hand most results relate to the situation where 300 ppb of TLDR-A0001 is added. As can be seen, even as low an amount as 10 ppb of additive results in fewer defects than the case where no additive is used. Increasing the level of additive to 300 ppb results in a further improvement. This is a surprising result because previously it had been thought that the total organic content should be as low as possible but these results show that even if the total organic content is increased to as high as 300 ppb by the addition of a cleaning agent, improvement in defect performance can be achieved.

Figure 13:
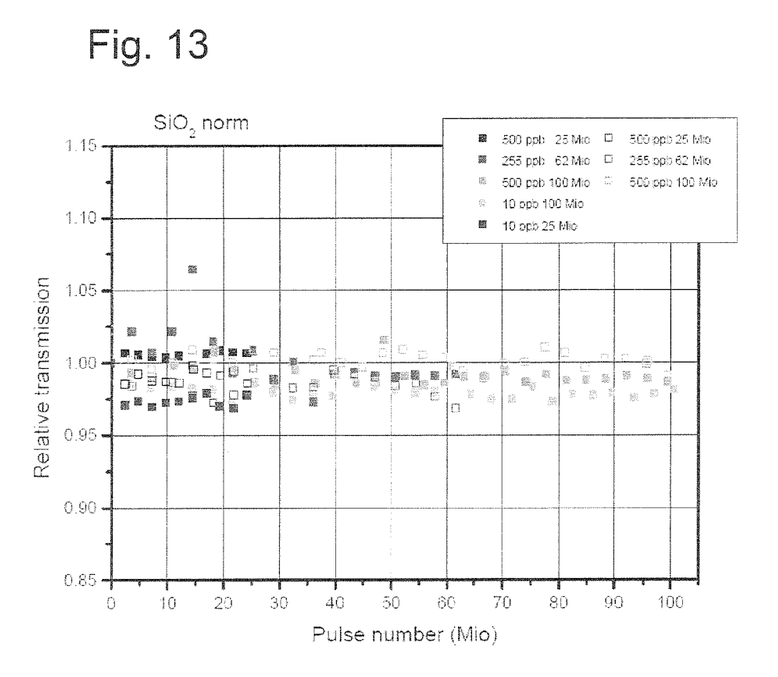
FIG. 13 illustrates the low effect of the presence of additive on transmission.

FIG. 13 shows for various levels of additive that the relative transmission through a $SiO_2$ final element is not particularly affected over time (increasing number of pulses) by the presence of up to 500 ppb of TLDR-A0001 in immersion liquid. This shows that even over time the final element does not get covered in an organic layer and thereby lose transmittance.

In one aspect there is provided an immersion lithographic apparatus comprising: a projection system; a liquid confinement structure configured at least partly to confine immersion liquid to an immersion space defined by the projection system, the liquid confinement structure and a substrate and/or substrate table; a liquid supply device comprising a first liquid source, a second liquid source comprising a source of an active cleaning agent, a mixer configured to mix liquid from the first liquid source with liquid from the second liquid source, and a conduit configured to provide mixed liquid from the mixer to the liquid confinement structure; and a controller configured to control supply of mixed liquid, comprising liquid from the first source and liquid from the second source, from the liquid supply device to the liquid confinement structure during impingement of a beam of radiation from the projection system through immersion liquid on a substrate.

In one aspect the first liquid source comprises an ultra pure water source. In one aspect the liquid of the second liquid source comprises a cleaner, desirably a top coat cleaner. In one aspect the cleaner comprises at least one selected from the following: a soap, a solvent, a surfactant, a glycol ether, an ester, an alcohol, a ketone. In one aspect the second liquid source is a source of a mixture of a soap and a solvent. In one aspect the liquid supply device comprises a further liquid source. In one aspect the controller is configured to control the mixer of the liquid supply device such that mixed liquid provided to the liquid confinement structure contains 300 ppb or less of a cleaner from the second liquid source in liquid from the first liquid source. In one aspect the mixer comprises a valve to meter liquid from one liquid source into liquid of another liquid source. In one aspect the mixer further comprises a first reservoir in fluid communication with the first liquid source and the second liquid source. In one aspect the mixer comprises a further reservoir in fluid communication with the first reservoir and the first liquid source. In one aspect the controller is configured to control a valve to meter liquid into the reservoir(s). In one aspect the controller is configured to measure a concentration of liquid from the second liquid source in the mixed liquid provided to the liquid confinement structure and to control mixing on the basis of the measurement in a feed-back manner. In one aspect the conduit is configured to provide mixed liquid to an opening in a surface of the liquid confinement structure which feces the substrate and/or substrate table, in one aspect liquid from the first liquid source is provided by a conduit to an opening into the immersion space without having liquid from the second liquid source mixed with it. In one aspect the substrate has a top coat on a resist on the substrate. In one aspect the mixer is configured to mix 1 ppm or less, desirably 500 ppb or less or 300 ppb or less, of additive from the second liquid source with liquid from the first liquid source.

In another aspect there is provided a method of maintaining an immersion apparatus clean wherein a soap or a soap and a solvent are added to immersion liquid passing through the apparatus during exposure of a substrate to radiation. In one aspect the immersion apparatus adds the soap or soap and solvent to the immersion liquid. In one aspect the adding is controlled in a feed-back manner by measuring a concentration of soap and solvent in the immersion liquid. In one aspect the adding comprises adding known quantities of soap, solvent and immersion liquid into a first reservoir to provide the reservoir with liquid with a known concentration of soap and solvent. In one aspect the adding further comprises adding a known quantity of liquid from a first reservoir to a second reservoir and adding a known quantity of immersion liquid to the second reservoir to provide the second reservoir with a known concentration of soap and solvent. In one aspect, the soap or soap and solvent are added in a quantity of less than 300 ppb.

In another aspect there is provided a method of maintaining an immersion apparatus clean, wherein an additive is added in a quantity of less than 300 ppb to immersion liquid passing through the apparatus during exposure of a substrate to radiation.

In another aspect there is provided a fluid supply apparatus configured to supply a dilute cleaning fluid to an immersion lithographic apparatus, the fluid supply apparatus comprising an immersion liquid supply, a cleaning fluid supply, a mixer configured to mix the cleaning fluid and the immersion liquid to a dilute mixture, a sensor configured to sense a concentration of the cleaning fluid in the dilute mixture and a controller connected to the sensor and the mixer, the controller configured to control: the supply of the cleaning fluid supplied from the cleaning fluid supply to the mixer; and the concentration of the cleaning fluid in the dilute mixture.

In another aspect there is provided a fluid handling structure configured to supply and confine immersion liquid to a space defined between a projection system and a facing surface facing the fluid handing structure, the facing surface comprising a surface of a substrate and/or a substrate table configured to support the substrate, wherein the fluid handling structure has an immersion liquid supply opening configured to supply immersion liquid to the space and a cleaning liquid supply opening configured to supply cleaning liquid to a space between the confinement structure and the facing surface. In one aspect the cleaning liquid supply opening is defined in an undersurface of the fluid handling structure. In one aspect the immersion liquid supply opening is defined in a surface of a fluid handling structure which defines the space. In one aspect the fluid handling structure is configured so that liquid exiting the cleaning liquid supply opening and liquid exiting the immersion liquid supply opening remain separated so that a patterned beam of radiation from the projection system passes substantially exclusively through immersion liquid provided through the immersion liquid supply opening. In an aspect, there is a lithographic apparatus comprising the fluid handling structure herein.

Although specific reference may be made in this text to the use of lithographic apparatus in the manufacture of ICs, it should be understood that the lithographic apparatus described herein may have other applications in manufacturing components with microscale, or even nanoscale features, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Controllers described above may have any suitable configuration for receiving, processing, and sending signals. For example, each controller may include one or more processors for executing the computer programs that include machine-readable instructions for the methods described above. The controllers may include data storage medium for storing such computer programs, and/or hardware to receive such medium.

One or more embodiments of the invention may be applied to any immersion lithography apparatus, in particular, but not exclusively, those types mentioned above, whether the immersion liquid is provided in the form of a bath, only on a localized surface area of the substrate, or is unconfined on the substrate and/or substrate table. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space maybe a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

Moreover, although this invention has been disclosed in the context of certain embodiments and examples, it will be understood by those skilled in the art that the present invention extends beyond the specifically disclosed embodiments to other alternative embodiments and/or uses of the invention and obvious modifications and equivalents thereof. In addition, while a number of variations of the invention have been shown and described in detail, other modifications, which are within the scope of this invention, will be readily apparent to those of skill in the art based upon this disclosure. For example, it is contemplated that various combination or sub-combinations of the specific features and aspects of the embodiments maybe made and still fall within the scope of the invention. Accordingly, it should be understood that various features and aspects of the disclosed embodiments can be combined with or substituted for one another in order to form varying modes of the disclosed invention. Thus, it is intended that the scope of the present invention herein disclosed should not be limited by the particular disclosed embodiments described above, but should be determined only by a fair reading of the claims that follow.

The descriptions above are intended to be illustrative, not limiting. Thus, it will be apparent to one skilled in the art that modifications may be made to the invention as described without departing from the scope of the claims set out below.

The invention claimed is:

1. An immersion lithographic apparatus comprising:
   a projection system;
   a liquid confinement structure configured at least partly to confine immersion liquid to an immersion space defined by the projection system, the liquid confinement structure and a substrate and/or substrate table;
   a liquid supply device comprising a first liquid source, a second liquid source comprising a source of an active cleaning agent, a mixer configured to mix liquid from the first liquid source with liquid from the second liquid source, and a conduit configured to provide mixed liquid from the mixer to the liquid confinement structure; and
   a controller configured to control supply of mixed liquid, comprising liquid from the first source and liquid from the second source, from the liquid supply device to the liquid confinement structure during impingement of a beam of radiation from the projection system through immersion liquid on the substrate,
   wherein the conduit provides mixed liquid to a first opening in a surface of the liquid confinement structure, and
   wherein liquid from the first liquid source is provided by a further conduit to a second opening, different from the first opening, into the immersion space without having liquid from the second liquid source mixed with it.

2. The immersion lithographic apparatus of claim 1, wherein the first liquid source comprises an ultra pure water source.

3. The immersion lithographic apparatus of claim 1, wherein the liquid of the second liquid source comprises a cleaner.

4. The immersion lithographic apparatus of claim 3, wherein the cleaner comprises at least one selected from the following: a soap, a solvent, a surfactant, a glycol ether, an ester, an alcohol, a ketone, an alkaline.

5. The immersion lithographic apparatus of claim 1, wherein the second liquid source is a source of a mixture of a soap and a solvent.

6. The immersion lithographic apparatus of claim 1, wherein the liquid supply device comprises a further liquid source.

7. The immersion lithographic apparatus of claim 1, wherein the controller is configured to control the mixer of the liquid supply device such that mixed liquid provided to the liquid confinement structure contains in the range of 10 ppb-300 ppb of a cleaner from the second liquid source in liquid from the first liquid source.

8. The immersion lithographic apparatus of claim 7, wherein the cleaner comprises a glycol ether or alkaline.

9. The immersion lithographic apparatus of claim 1, wherein the mixer comprises a valve to meter liquid from one liquid source into liquid of another liquid source.

10. The immersion lithographic apparatus of claim 9, wherein the mixer further comprises a first reservoir in fluid communication with the first liquid source and the second liquid source.

11. The immersion lithographic apparatus of claim 10, wherein the mixer comprises a further reservoir in fluid communication with the first reservoir and the first liquid source.

12. The immersion lithographic apparatus of claim 10, wherein the controller is configured to control a valve to meter liquid into the reservoir(s).

13. The immersion lithographic apparatus of claim 1, wherein the controller is configured to measure a concentration of liquid from the second liquid source in the mixed liquid provided to the liquid confinement structure and to control mixing on the basis of the measurement in a feed-back manner.

14. The immersion lithographic apparatus of claim 1, further comprising a substrate, wherein the substrate has a top coat on a resist on the substrate.

15. The immersion lithographic apparatus of claim 1, wherein the mixer is configured to mix 1 ppm or less of additive from the second liquid source with liquid from the first liquid source.

16. The immersion lithographic apparatus of claim 1, wherein the second opening is located above the first opening.

17. The immersion lithographic apparatus of claim 1, wherein the conduit provides mixed liquid to the first opening at a same time that liquid from the first liquid source is provided by the further conduit to the second opening.

18. The immersion lithographic apparatus of claim 1, wherein the surface of the liquid confinement structure faces the substrate and/or substrate table.

19. A device manufacturing method, comprising:

projecting a beam of a radiation, through an immersion liquid, onto a substrate;

at least partly confining the immersion liquid to an immersion space defined by a projection system, a liquid confinement structure and the substrate and/or a substrate table;

mixing a liquid from a first liquid source with an active cleaning agent from a second liquid source to form a mixed liquid; and controlling supply of the mixed liquid to the liquid confinement structure during impingement of the beam of radiation through the immersion liquid onto the substrate, wherein mixed liquid is supplied through a conduit to a first opening in a surface of the liquid confinement structure and liquid from the first liquid source is supplied through a further conduit to a second opening, different from the first opening, into the immersion space without having liquid from the second liquid source mixed with it.

* * * * *